United States Patent
Doo et al.

(10) Patent No.: US 9,704,558 B2
(45) Date of Patent: Jul. 11, 2017

(54) REFRESH METHOD OF CONTROLLING SELF-REFRESH CYCLE WITH TEMPERATURE

(71) Applicant: Samsung Electronics Co., Ltd., Suwon-si (KR)

(72) Inventors: Su-yeon Doo, Seoul (KR); Tae-young Oh, Seoul (KR); Cheol Kim, Seoul (KR); Geun-tae Park, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/224,683

(22) Filed: Aug. 1, 2016

(65) Prior Publication Data

US 2017/0117033 A1    Apr. 27, 2017

(30) Foreign Application Priority Data

Oct. 22, 2015 (KR) .................. 10-2015-0147550

(51) Int. Cl.
| | | |
|---|---|---|
| *G11C 7/00* | (2006.01) | |
| *G11C 11/406* | (2006.01) | |
| *G11C 11/4091* | (2006.01) | |
| *G11C 11/408* | (2006.01) | |

(52) U.S. Cl.
CPC .... *G11C 11/40626* (2013.01); *G11C 11/4082* (2013.01); *G11C 11/4087* (2013.01); *G11C 11/4091* (2013.01); *G11C 11/406* (2013.01); *G11C 11/40618* (2013.01)

(58) Field of Classification Search
CPC ............ G11C 11/406; G11C 11/40626; G11C 11/40615; G11C 2211/4067; G11C 11/40618
USPC ....................................... 365/222, 211, 233.1
See application file for complete search history.

(56) References Cited

U.S. PATENT DOCUMENTS

| | | | |
|---|---|---|---|
| 5,446,696 A | 8/1995 | Ware et al. | |
| 6,199,139 B1 | 3/2001 | Katayama et al. | |
| 7,646,661 B2 | 1/2010 | Koga et al. | |
| 7,764,561 B2 | 7/2010 | Lee | |
| 8,549,366 B2 | 10/2013 | Higeta et al. | |
| 8,675,438 B2 | 3/2014 | Noh et al. | |
| 8,724,415 B2 | 5/2014 | Kuroda | |
| 8,787,105 B2 * | 7/2014 | Chen ................. | G11C 11/40615 365/211 |
| 9,076,504 B2 | 7/2015 | Lee et al. | |

* cited by examiner

*Primary Examiner* — David Lam
(74) *Attorney, Agent, or Firm* — Muir Patent Law, PLLC

(57) ABSTRACT

Provided is a method of refreshing a memory device by controlling a self-refresh cycle according to temperature. In the method, first self-refresh and second self-refresh are performed according to inner temperature of the memory device and a self-refresh cycle is controlled such that an all-bank-refresh (ABR) operation is not performed simultaneously with the start of the second self-refresh. The ABR operation is performed at the start of third self-refresh when the sum of a section of the first self-refresh in which the ABR operation is not performed and a section of the second self-refresh in which the ABR operation is not performed corresponds to a self-refresh cycle.

20 Claims, 16 Drawing Sheets

FIG. 9D

| DT | CNT |
|---|---|
| 0 | CNT_P[0:0] |
| 1 | CNT_P[1:0] |
| 2 | CNT_P[2:0] |
| 3 | CNT_P[3:0] |
| 4 | CNT_P[4:0] |
| 5 | CNT_P[5:0] |
| 6 | CNT_P[6:0] |

FIG. 9E

| INPUT | | | OUTPUT | |
|---|---|---|---|---|
| CIN | A | B | S | C |
| 0 | 0 | 0 | 0 | 0 |
| 1 | 0 | 0 | 1 | 0 |
| 0 | 1 | 0 | 1 | 0 |
| 1 | 1 | 0 | 0 | 1 |
| 0 | 0 | 1 | 1 | 0 |
| 1 | 0 | 1 | 0 | 1 |
| 0 | 1 | 1 | 0 | 1 |
| 1 | 1 | 1 | 1 | 1 |

REFRESH METHOD OF CONTROLLING SELF-REFRESH CYCLE WITH TEMPERATURE

CROSS-REFERENCE TO RELATED APPLICATION

This application claims the benefit of priority under 35 USC §119(a) to Korean Patent Application No. 10-2015-0147550, filed on Oct. 22, 2015, in the Korean Intellectual Property Office, the disclosure of which is incorporated herein in its entirety by reference.

BACKGROUND

The disclosure relates to semiconductor devices, and more particularly, to a refresh method of adaptively changing an all-bank-refresh (ABR) cycle of self-refreshing a memory device according to temperature.

Volatile memory devices such as a dynamic random access memory (DRAM) perform a refresh operation to retain data stored therein. The DRAM performs auto-refresh to refresh memory cell rows according to a refresh command periodically supplied thereto, and perform self-refresh to refresh the memory cell rows in response to a built-in timer according to an 'enter self-refresh' command SRE and an 'exit self-refresh' command SRX. If an all-bank-refresh (ABR) operation is performed whenever self-refresh is performed and the 'enter self-refresh' command SRE is frequently given, refresh operations are often performed more frequently than is necessary to retain data of DRAM cells. Accordingly, refresh time of the DRAM may unnecessarily increase, refresh power consumption may increase and thus the performance of the DRAM may be degraded.

SUMMARY

The disclosure provides a refresh method of controlling a self-refresh cycle according to temperature of a memory device so as to decrease refresh power consumption.

In some embodiments, a method of refreshing a memory device is provided. The method may include: generating a refresh clock signal according to an enter self-refresh command and an exit self-refresh command; and performing self-refresh to refresh memory cell rows according to the refresh clock signal, wherein, the step of performing self-refresh comprises: performing a first self-refresh according to a first inner temperature of the memory device; and performing a second self-refresh according to a second inner temperature of the memory device, and wherein, when the second inner temperature is different than the first inner temperature, controlling a self-refresh cycle in a manner such that an all-bank-refresh (ABR) operation of the second self-refresh is not performed simultaneously with start of the second self-refresh.

In some embodiments, the performing of the self-refresh may comprise: generating the refresh clock signal having a fixed cycle during the first self-refresh and the second self-refresh; setting a first maximum count value according to the first inner temperature during the first self-refresh; setting a second maximum count value according to the second inner temperature during the second self-refresh; and performing an ABR operation of the second self-refresh, based on the refresh clock signal and the first and second maximum count values.

In some embodiments, when the second inner temperature is higher than the first inner temperature, the second maximum count value may be set to be greater than the first maximum count value.

In some embodiments, the performing of the ABR operation of the second self-refresh may comprise: calculating a first-temperature cycle value by multiplying a number of first clock cycles of the refresh control signal during the first self-refresh by the first maximum count value; calculating a second-temperature cycle value by multiplying a number of second clock cycles of the refresh control signal during the second self-refresh by the second maximum count value; and starting the ABR operation of the second self-refresh at a point of time corresponding to an average of the first-temperature cycle value and the second-temperature cycle value.

In some embodiments, the performing of the self-refresh may comprise: generating a first refresh clock signal having a first cycle according to the first inner temperature during the first self-refresh; generating a second refresh clock signal having a second cycle according to the second inner temperature during the second self-refresh; setting a maximum count value during the first self-refresh and the second self-refresh; and performing an ABR operation of the second self-refresh, based on the first and second refresh clock signals having the first and second cycles and the maximum count value.

In some embodiments, when the second temperature is higher than the first temperature, the second cycle may be set to be shorter than the first cycle.

In some embodiments, the performing of the ABR operation of the second self-refresh may comprise: counting a number of first clock cycles of the first refresh clock signal during the first self-refresh; counting a number of second clock cycles of the second refresh clock signal during the second self-refresh right after counting the number of the first clock cycles; and starting the ABR operation of the second self-refresh when the number of the second clock cycles reaches the maximum count value.

In some embodiments, a method of refreshing a memory device is disclosed. The method may include: performing a first self-refresh according to a first inner temperature of the memory device, wherein the first self-refresh includes a section where an all-bank-refresh (ABR) operation of the first self-refresh is performed but interrupted before completing the first self-refresh due to start of a first normal operation; performing a second self-refresh according to a second inner temperature of the memory device, wherein the second self-refresh includes a section where an all-bank-refresh (ABR) operation of the second self-refresh is performed but interrupted before completing the second self-refresh due to start of a second normal operation; and performing an all-bank-refresh (ABR) operation at start of a third self-refresh when a sum of the first section of the first self-refresh and the second section of the second self-refresh corresponds to a self-refresh cycle.

In some embodiments, the performing of the ABR operation at the start of the third self-refresh may comprise: counting a number of first clock cycles of a refresh clock signal having a first cycle in the first section; counting a number of second clock cycles of the refresh clock signal having a second cycle in the second section; and performing the ABR operation at the start of the third self-refresh when a sum of a first time which is a product of the first cycle and the number of the first clock cycles and a second time which is a product of the second cycle and the number of the second clock cycles corresponds to the self-refresh cycle.

In some embodiments, the ABR operation of the third self-refresh may be performed according to an enter self-refresh command.

In some embodiments, the method may include: generating a first refresh clock signal having a first cycle according to the first inner temperature of the memory device during the first self-refresh; and generating a second refresh clock signal having a second cycle according to the second inner temperature of the memory device during the second self-refresh.

In some embodiments, when the second inner temperature is higher than the first inner temperature, the second cycle may be set to be shorter than the first cycle In some embodiments, when a sum of the first time and the second time does not correspond to the self-refresh cycle, the performing of the ABR operation of the third self-refresh may comprise inputting the sum of the first time and the second time to a flip-flop according to an exit self-refresh command.

In some embodiments, the ABR operation of the self-refresh may be started at a point of time when the sum of the first time and the second time and an output of the flip-flop corresponds to the self-refresh cycle.

In some embodiments, each of the counting of the first clock cycles and the counting of the second clock cycles may comprise: counting the refresh clock signal, dividing the refresh clock signal and generating divided clock signals; providing the number of the first clock cycles by selectively latching the divided clock signals based on information regarding the first inner temperature of the memory device; and providing the number of the second clock cycles by selectively latching the divided clock signals based on information regarding the second inner temperature of the memory device In some embodiments, a method of refreshing a memory device is disclosed. The method may include: generating a refresh clock signal according to an enter self-refresh command and an exit self-refresh command; and performing self-refresh to refresh memory cell rows according to the refresh clock signal, wherein, the step of performing self-refresh may comprise: performing a first self-refresh according to a first inner temperature of the memory device; and performing a second self-refresh according to a second inner temperature of the memory device, and wherein, when the second inner temperature is higher than the first inner temperature, controlling a self-refresh cycle in a manner such that an all-bank-refresh (ABR) operation of the second self-refresh is performed at a later point of time after the start of the second self-refresh.

BRIEF DESCRIPTION OF THE DRAWINGS

Exemplary embodiments of the inventive concept will be more clearly understood from the following detailed description taken in conjunction with the accompanying drawings in which:

FIGS. 9A to 9E are diagrams illustrating a refresh control circuit according to an exemplary embodiment;

DETAILED DESCRIPTION OF THE EMBODIMENTS

Figure 1:
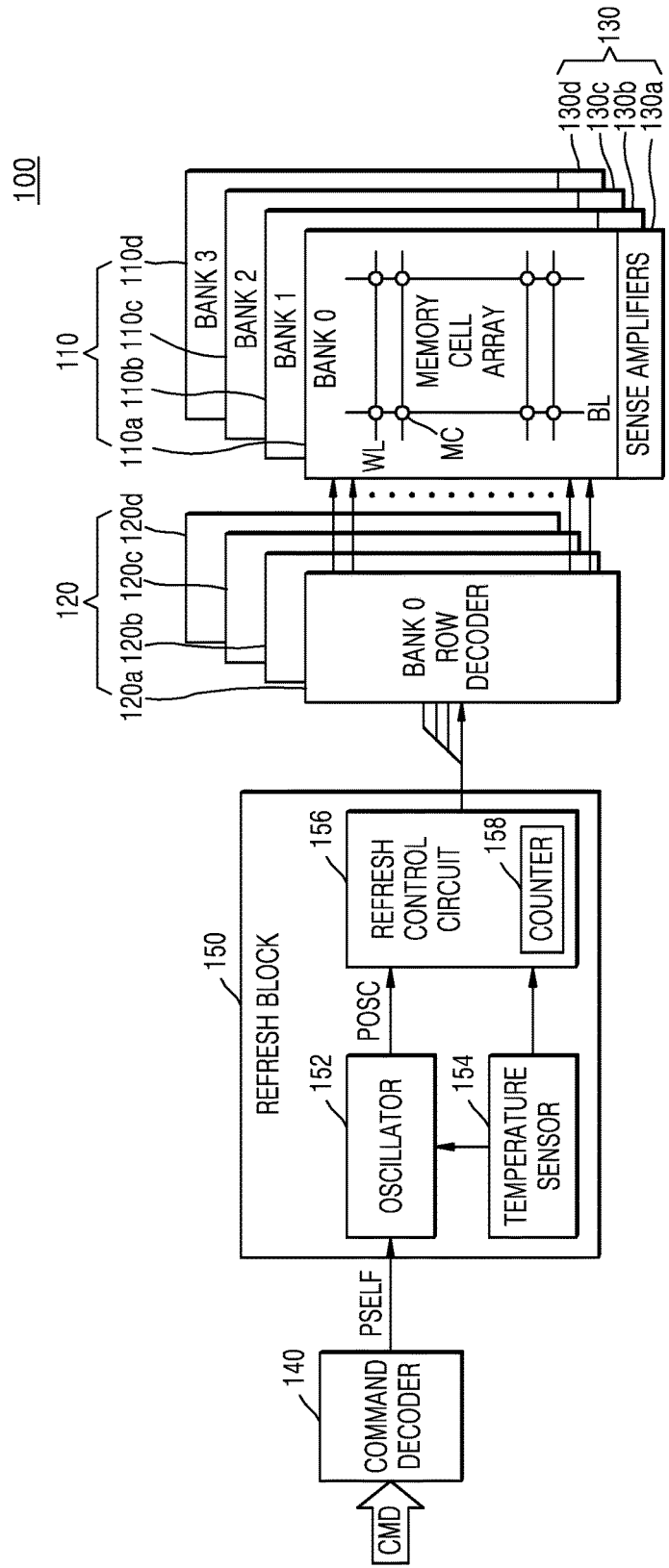
FIG. 1 is a block diagram of a memory device capable of performing a refresh method according to an exemplary embodiment.

Hereinafter, embodiments of the inventive concept will be described in detail with reference to the accompanying drawings. These embodiments are provided so that this disclosure will be thorough and complete and will fully convey the concept of the invention to those of ordinary skill in the art. The example embodiments may be embodied in many different forms and should not be construed as being limited to the embodiments set forth herein. These embodiments should be understood to cover all modifications, equivalents, and alternatives falling within the scope of the invention. The same reference numerals represent the same elements throughout the drawings. In the drawings, the sizes of elements illustrated in the drawings may be exaggerated for clarity.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular embodiments only and is not intended to be limiting of the inventive concept. As used herein, the singular forms 'a', 'an' and 'the' are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term ext of the relevant art and will not be interpreted in an idealized or overly formal sense unless expressly so defined herein.ary skill eceding a list of elements, modify the entire list of elements and do not modify the individual elements of the list.

A semiconductor memory device, e.g., a dynamic random access memory (DRAM), is a memory device having finite data retention characteristics. As DRAM process scaling has been continuously developed, capacitance values of cell capacitors have decreased. Thus, a bit error rate (BER) may increase and thus the reliability of data stored in memory cells may be lowered. To address this problem, a DRAM performs a refresh operation to retain data stored in the memory cells thereof. The DRAM semiconductor memory device is typically embodied in the form of a single semiconductor chip. The embodiments described refer to structure that may be implemented on a single semiconductor chip and a method that may be performed on a single semiconductor chip. However, the embodiments also contemplate that the DRAM semiconductor memory devices and methods described herein may be implemented on more than one chip, such as a with a group of semiconductor memory chips packaged in a single semiconductor package (e.g., where a refresh controller as described herein—either part of one of the memory chips or embodied as a separate controller chip—controls refresh operations of the plural semiconductor chips).

As the DRAM performs a normal operation including a read/write operation, the inner temperature of the DRAM may increase. After the normal operation is performed, a first temperature of the DRAM at the start of self-refresh performed according to an 'enter self-refresh' command SRE and a second temperature of the DRAM at a midpoint in the self-refresh may be different from each other. The second temperature may be lower than the first temperature. In the DRAM, a self-refresh cycle tSREFI may be differently set according to temperature, based on a refresh clock signal POSC which has an effect on self-refresh. In exemplary embodiments of the inventive concept, refresh methods of controlling an all-bank-refresh (ABR) cycle of self-refresh based on the refresh clock signal POSC such that an ABR operation is not always performed whenever self-refresh is performed.

FIG. 1 is a block diagram of a memory device 100 capable of performing a refresh memory method according to an exemplary embodiment.

Referring to FIG. 1, the memory device 100 may be a semiconductor device-based storage device. For example, the memory device 100 may a DRAM, a synchronous DRAM (SDRAM), a double data rate SDRAM (DDR SDRAM), a pow power double data rate SDRAM (LPDDR SDRAM), a graphics double data rate SDRAM (GDDR SDRAM), a DDR2 SDRAM, a DDR3 SDRAM, a DDR4 SDRAM, or the like. The memory device 100 may be a memory other than DRAM that includes memory that periodically requires a refresh operation to properly retain stored data.

In some embodiments, the memory device 100 may be a single memory chip or a memory module including a plurality of memory devices. In some exemplary embodiments, the memory device 100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

In this exemplary embodiment, the memory device 100 may include a memory cell array 110, a row decoder 120, a sense amplification unit 130, a command decoder 140, and a refresh block 150.

The memory cell array 110 may include first to fourth bank arrays 110a, 110b, 110c, and 110d that may be accessed simultaneously (read, write, refresh, e.g.). Each of the first to fourth bank arrays 110a, 110b, 110c, and 110d may be accessed while another of the bank arrays is accessed. Although the memory cell array 110 of the exemplary embodiment of FIG. 1 includes four bank arrays 110a, 110b, 110c, and 110d, the inventive concept is not limited. The memory cell array 110 may include more than four or less than four bank arrays. Each of the first to fourth bank arrays 110a, 110b, 110c, and 110d may include a plurality of memory cells MC provided in a matrix including rows and columns. In some embodiments, each of the plurality of memory cells MC may have different physical characteristics. For example, operation speeds of the plurality of memory cells MC may be different from each other. In some embodiments, each of the plurality of memory cells MC may include a plurality of pages. For example, one page may include one row of memory cells. In some embodiments, each of the first to fourth bank arrays 110a, 110b, 110c, and 110d includes a plurality of word lines WL and a plurality of bit lines BL connected to the memory cells MC. The plurality of word lines WL may be connected to rows of the memory cells MC. The plurality of bit lines BL may be connected to columns of the memory cells MC. Rows of the memory cells MC connected to one word line WL may be referred to as memory cell rows.

The row decoder 120, in some embodiments, may include first to fourth bank row decoders 120a, 120b, 120c, and 120d connected to the first to fourth bank arrays 110a, 110b, 110c, and 110d, respectively. Each of the first to fourth bank row decoders 120a, 120b, 120c, and 120d may receive a row address of the bank corresponding thereto from an address buffer or receive a refresh row address from the refresh block 150. Each of the first to fourth bank row decoders 120a, 120b, 120c, and 120d may decode the row address or the refresh row address to activate a word line WL corresponding to the row address or the refresh row address. For example, each of the first to fourth bank row decoders 120a, 120b, 120c, and 120d may apply a word line driving voltage to the activated word line WL.

The sense amplification unit 130, in some embodiments, may include first to fourth bank sense amplifiers 130a, 130b, 130c, and 130d connected to the first to fourth bank arrays 110a, 110b, 110c, and 110d, respectively. Each of the first to fourth bank sense amplifiers 130a, 130b, 130c, and 130d may sense and amplify data read by a word line WL activated by the first, second, third or fourth bank array 110a, 110b, 110c, or 110d corresponding thereto. When the activated word line WL corresponds to a refresh row address, the amplified data is provided to the memory cell MC and restored in a cell capacitor to be refreshed. When the activated word line WL corresponds to a row address, the sensed, amplified, and read data may be provided to an external device via a data input/output buffer (not shown).

The first to fourth bank arrays 110a, 110b, 110c, and 110d, the first to fourth bank row decoders 120a, 120b, 120c, and 120d, and the first to fourth bank sense amplifiers 130a, 130b, 130c, and 130d may form first to fourth banks BANK0, BANK1, BANK2, and BANK3 that may be accessed simultaneously (read, write, refresh, e.g.). Each of the first to fourth banks BANK0, BANK1, BANK2, and BANK3 may be accessed while another of the bank is accessed. In the present embodiment, an example of the memory device 100 including the four banks BANK0, BANK1, BANK2, and BANK3 is illustrated. According to another example, the memory device 100 may include an arbitrary number of banks (e.g., more than four banks or less than four banks).

The command decoder 140 may receive a command signal CMD from an external device, e.g., a memory controller, and decode the command signal CMD. The command decoder 140 decodes the command signal CMD (e.g., a clock enable signal CKE, a chip selection signal /CS, a row address strobe signal /RAS, a column address strobe signal /CAS, a write enable signal /WE, or the like), and generate control signals corresponding to the command signal CMD.

In some embodiments, the command decoder 140 may generate a self-refresh signal PSELF according to a 'enter self-refresh' command SRE. The self-refresh signal PSELF may instruct the refresh block 150 to generate a refresh clock signal POSC and to perform self-refresh to refresh data of memory cells MC connected to a memory cell row in the memory cell array 110 according to the refresh clock signal POSC.

The refresh block 150 generates the refresh clock signal POSC according to the self-refresh signal PSELF and controls a self-refresh cycle tSREFI based on the refresh clock signal POSC. In this exemplary embodiment, the refresh block 150 may include an oscillator 152, a temperature sensor 154, and a refresh control circuit 156.

The oscillator 152 may be configured to receive the self-refresh signal PSELF generated by the command decoder 140 and generate the refresh clock signal POSC according to the self-refresh signal PSELF. The temperature sensor 154 may measure temperature of the memory device 100 and provide the measured temperature as temperature information to the oscillator 152 and the refresh control circuit 156. In one embodiment, the temperature sensor 154 may be provided in a different circuit region inside the memory device 100 rather than in the refresh block 150. In one embodiment, information regarding the temperature of the memory device 100 may be provided from an external device.

In one embodiment, the oscillator 152 may generate a refresh clock signal POSC to have a cycle which varies according to the temperature information received from the temperature sensor 154. In another embodiment, the oscillator 152 may generate a refresh clock signal POSC to have a fixed cycle regardless of the temperature information. The refresh clock signal POSC may be supplied to the refresh control circuit 156 to be used to control the self-refresh cycle tSREFI.

In some embodiments, the refresh control circuit 156 may include a counter 158 configured to receive and count the refresh clock signal POSC based on the temperature information. An output of the counter 158 may be provided as a refresh row address to the first to fourth banks BANK0, BANK1, BANK2, and BANK3. The refresh control circuit 156 may set a maximum count value of the counter 158 on a basis of the temperature information. The counter 158 may count the refresh clock signal POSC to the set maximum count value.

The refresh block 150 may control an ABR operation to be not performed simultaneously with the start of self-refresh, based on a refresh clock signal POSC having a fixed cycle and the maximum count value which is set according to temperature. For example, the refresh block 150 may control an ABR operation in a manner such that the ABR operation is started at a later time after the start of a self-refresh operation.

In some embodiments, the refresh block 150 may control the ABR operation to be not performed simultaneously with the start of self-refresh, based on a refresh clock signal POSC having a cycle varying according to temperature and a fixed maximum count value. For example, the refresh block 150 may perform first self-refresh and second self-refresh according to temperature, and control the ABR operation to be performed at the start of third self-refresh when the sum of a section of the first self-refresh in which the ABR operation is not performed and a section of the second self-refresh in which the ABR operation is not performed corresponds to a self-refresh cycle. The self-refresh cycle is variable since a point of time when the ABR operation is to be performed is controlled by the refresh block 150.

Figure 2:
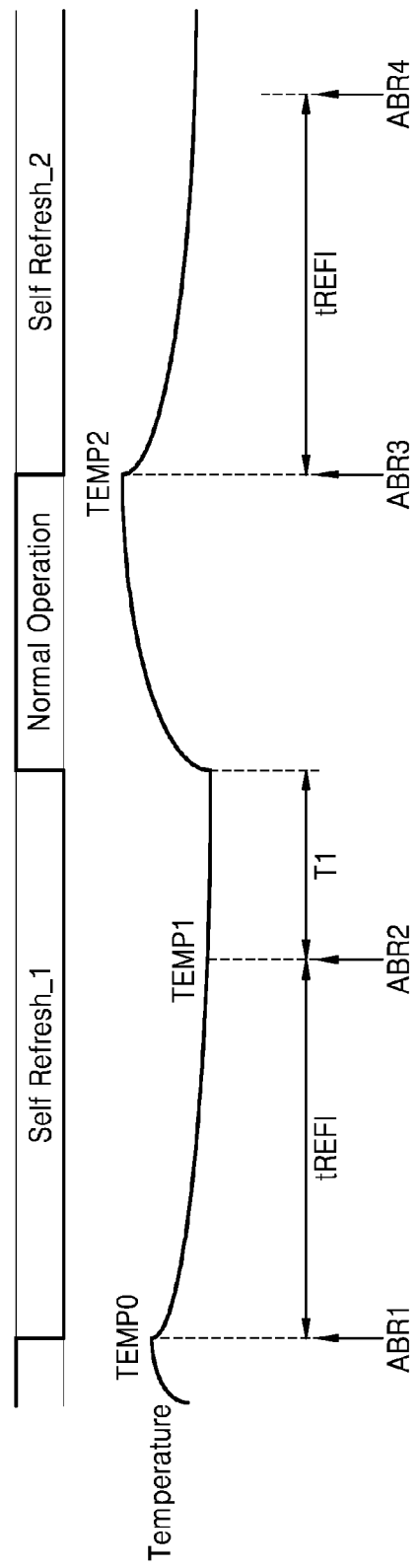
FIG. 2 is a diagram illustrating an excessive refresh operation of a memory device.

FIG. 2 is a diagram illustrating an excessive refresh operation of a conventional memory device.

Referring to FIG. 2, self-refresh and a normal operation such as a write or read operation may be performed on a memory device, e.g., a DRAM. The self-refresh may be started according to an 'enter self-refresh' command SRE and ended according to an 'exit self-refresh' command SRX.

In first self-refresh Self Refresh_1, a first ABR operation ABR1 may be performed at the start of self-refresh according to the enter self-refresh command SRE and a second ABR operation ABR2 may be performed after a refresh cycle tREFI. The refresh cycle tREFI is a refresh cycle defined in memory device standards, e.g., a cycle in which memory cell rows are refreshed at time intervals of 32 ms or 64 ms. The refresh cycle tREFI may be monitored by a memory controller, such as by running a clock of the memory controller. The memory controller may cause an appropriate refresh cycle to be performed (e.g., an ABR operation or equivalent) on the DRAM every refresh cycle tREFI so that memory cell rows are not left unrefreshed for a period longer than the refresh cycle tREFI.

Before a refresh operation is completed according to the second ABR operation ABR2, the first self-refresh Self Refresh_1 may be ended according to the 'exit self-refresh' command SRX and the normal operation may be performed. A time period T1 during which the second ABR operation ABR2 is performed may be shorter than the refresh cycle tREFI.

After the normal operation is performed, in second self-refresh Self Refresh_2, a third ABR operation ABR3 may be performed at the start of self-refresh according to the 'enter self-refresh' command SRE and a fourth ABR operation ABR3 may be performed after the refresh cycle tREFI. When the third ABR operation ABR3 of the second self-refresh Self Refresh_2 is performed after the time period T1 during which the second ABR operation ABR2 of the first self-refresh Self Refresh_1 is performed, the conventional DRAM may be refreshed more frequently than is necessary to retain data of memory cells thereof, thereby increasing refresh power consumption.

In refresh methods according to example embodiments of the inventive concept which will be described below, an ABR cycle of self-refresh is controlled such that the ABR operation is not always performed (e.g., not performed simultaneously) whenever self-refresh is started so as to decrease refresh power consumption. Also, referring to FIG. 2, when it is considered that temperature TEMP0 during the first ABR operation ABR1, temperature TEMP1 during the second ABR operation ABR2, and temperature TEMP2 during the third ABR operation ABR3 are different from one another, refresh power consumption may be more decreased by setting a refresh cycle to be short when temperature of a memory device is high compared to a predetermined temperature and to be long when temperature a memory device is low compared to a predetermined temperature.

Figure 3:
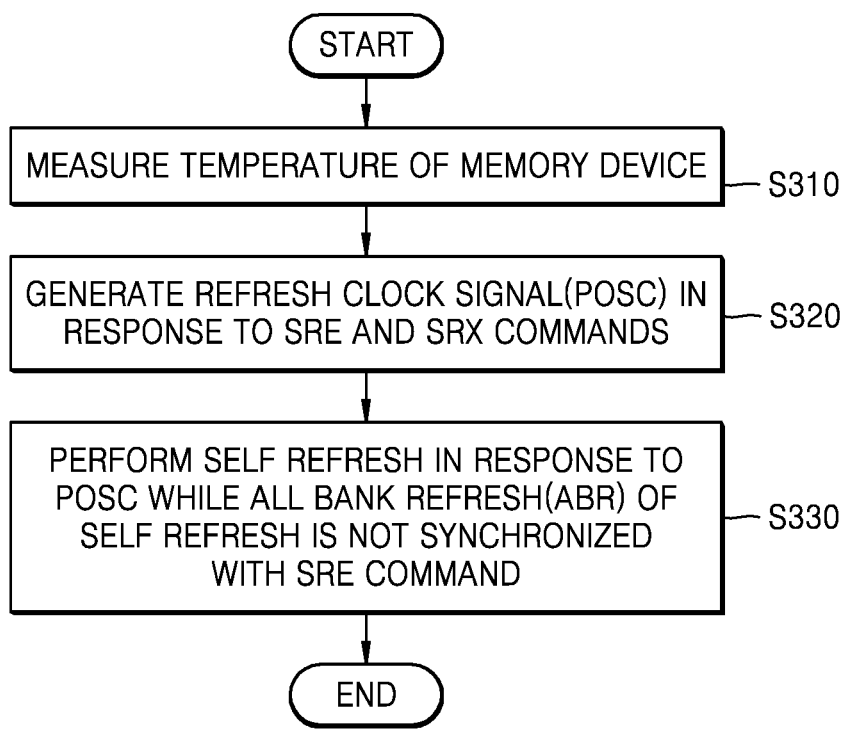
FIG. 3 is a flowchart of a method of refreshing a memory device according to an exemplary embodiment.

FIG. 3 is a flowchart of a method of refreshing a memory device according to an exemplary embodiment.

Referring to FIGS. 1 and 3, the temperature sensor 154 of the memory device 100 measures temperature of the memory device 100 (operation S310). The oscillator 152 generates a refresh clock signal POSC in response to a self-refresh signal PSELF according to an 'enter self-refresh' command SRE and an 'exit self-refresh' command SRX (operation S320). In one embodiment, information regarding the temperature of the memory device 100 may be provided from an external device which senses the temperature of the memory device 100. The refresh control circuit 156 performs self-refresh to refresh memory cell rows of the memory cell array 110 according to the refresh clock signal POSC (operation S330).

In the performing of the self-refresh (operation S330), an ABR operation of self-refresh is not synchronized with an 'enter self-refresh' command SRE. For example, in the performing of the self-refresh (operation S330), first self-refresh and second self-refresh are performed according to the temperature of the memory device 100 and an ABR operation is controlled such that the ABR operation is not performed simultaneously with receiving the 'enter self-refresh command' SRE. Thus, an ABR cycle of self-refresh may be changed. The changing of the ABR cycle of self-refresh will be described in detail with reference to FIGS. 4 to 10 below.

Figure 4:
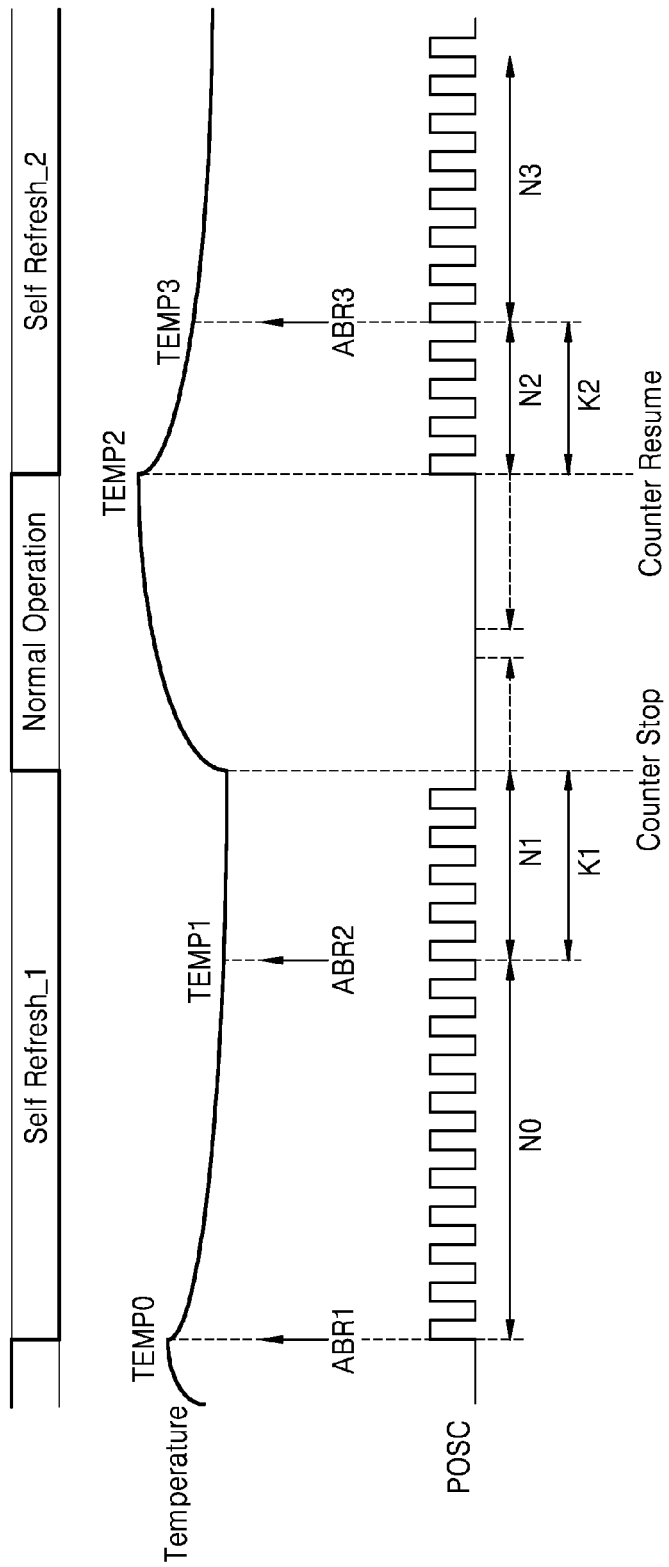
FIGS. 4 and 5 are diagrams illustrating a refresh method of changing an all-bank-refresh (ABR) cycle of self-refresh according to an exemplary embodiment.
Figure 5:
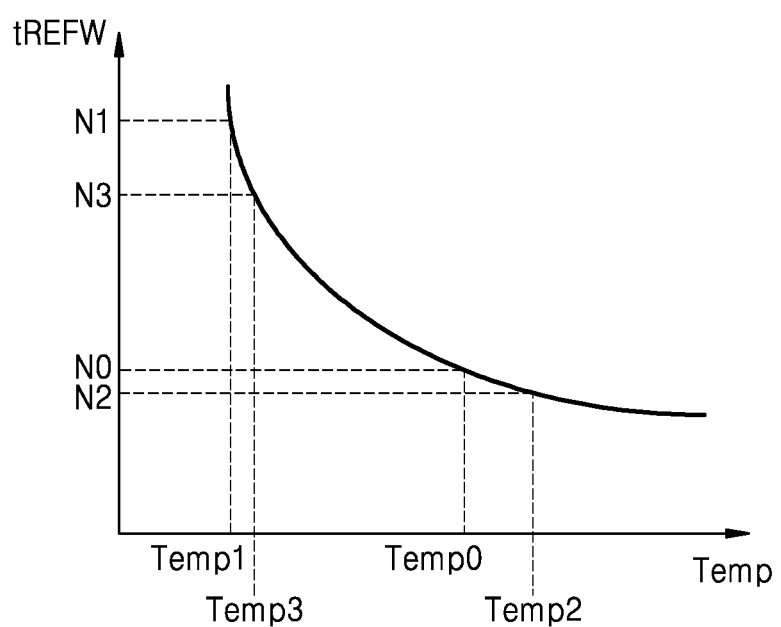

FIGS. 4 and 5 are diagrams illustrating a refresh method of changing an ABR cycle of self-refresh according to an exemplary embodiment. FIG. 4 is a timing diagram illustrating a change in a point of time when an ABR operation of self-refresh is to be performed. FIG. 5 is a graph showing a refresh window tREFW according to a temperature of the memory device 100 of FIG. 1.

Referring to FIG. 4, a normal operation may be performed between first self-refresh Self Refresh_1 and second self-refresh Self Refresh_2. The normal operation may be performed before refresh processing is completed according to a second ABR operation ABR2 of the first self-refresh Self Refresh_1. The refresh processing may be understood as an operation of refreshing all memory cell rows of the whole banks BANK0 to BANK3 of the memory cell array 110 of FIG. 1. In the present embodiment, a refresh clock signal POSC having a fixed cycle may be generated and provided by the oscillator 152 regardless of the temperature of the memory device 100 of FIG. 1 during the first and second self-refreshes Self Refresh_1 and Self Refresh_2.

During the first self-refresh Self Refresh_1, first temperature TEMP0 of the memory device 100 in a first ABR operation ABR1 and second temperature TEMP1 of the memory device 100 in a second ABR operation ABR2 may be different from each other. For example, the second temperature TEMP1 may be lower than the first temperature TEMP0. Third temperature TEMP2 of the memory device 100 at the start of the second self-refresh Self Refresh_2 may be high due to the normal operation performed right before the start of second self-refresh Self Refresh_2. For example, the third temperature TEMP2 may be higher than the first temperature TEMP0.

According to the first ABR operation ABR1 of the first self-refresh Self Refresh_1, the refresh control circuit 156 of FIG. 1 may control refresh processing to be performed on all the memory cell rows in the whole banks BANK0 to BANK3 according to the first temperature TEMP0 while counting the refresh clock signal POSC. A section in which the first ABR operation ABR1 is performed according to the first temperature TEMP0 will be referred to as a first refresh window N0.

According to the second ABR operation ABR2 of the first self-refresh Self Refresh_1, the refresh control circuit 156 may set a maximum count value of the counter 158 of FIG. 1 to be a first maximum count value K1 according to the second temperature TEMP1. The second ABR operation ABR2 performed according to the refresh clock signal POSC and the first maximum count value K1 may have a second refresh window N1.

The second refresh window N1 may be wider than the first refresh window N0 as illustrated in FIG. 5. This means that a refresh cycle may be set to be long at the second temperature TEMP1 since the second temperature TEMP1 is lower than the first temperature TEMP0 and thus the second refresh window N1 is wider than the first refresh window N0. However, the second refresh window N1 of the second ABR operation ABR2 illustrated in FIG. 4 may be smaller than the first refresh window N0 of the first ABR operation ABR1 due to the normal operation performed before refresh processing according to the second ABR operation ABR2 is ended.

When the second self-refresh Self Refresh_2 is started after the normal operation is performed, the refresh control circuit 156 may set a maximum count value of the counter 158 to be a second maximum count value K2 according to the third temperature TEMP2. In some embodiments, the second maximum count value K2 may be set to be greater than the first maximum count value K1. This means that a refresh cycle may be set to be short at the third temperature TEMP2 since the third temperature TEMP2 is higher than the second temperature TEMP1 and thus the second maximum count value K2 is set to be greater than the first maximum count value K1.

After the second self-refresh Self Refresh_2 is started, a third refresh window N2 may be determined according to the refresh clock signal POSC and the second maximum count value K2. During the third refresh window N2, refresh processing may be performed according to the second ABR operation ABR2 of the first self-refresh Self Refresh_1. Thus, the second ABR operation ABR2 of the first self-refresh Self Refresh_1 may be performed during the second refresh window N1 and the third refresh window N2.

In some embodiments, a point of time when a third ABR operation ABR3 is to be started during the second self-refresh Self Refresh_2 may be determined based on the first and second maximum count values K1 and K2 and the second and third refresh windows N1 and N2. The point of time when the third ABR operation ABR3 is to be started may be determined based on an average of a first-temperature cycle value K1×N1 which is the product of the first maximum count value K1 and the second refresh window N1 and a second-temperature cycle value K2×N2 which is a product of the second maximum count value K2 and the third refresh window N2. That is, the third ABR operation ABR3 of the second self-refresh Self Refresh_2 is not performed simultaneously with the start of the second self-refresh Self Refresh_2.

According to the third ABR operation ABR3 of the second self-refresh Self Refresh_2, the refresh control circuit 156 may perform refreshing processing on all the memory cell rows in the whole banks BANK0 to BANK3 according to fourth temperature TEMP3 while the counting refresh clock signal POSC and thus have a fourth refresh window N3.

In some embodiments, in the first and second self-refreshes Self Refresh_1 Self Refresh_2, the first refresh window N0 according to the first ABR operation ABR1, the second and third refresh windows N1 and N2 according to the second ABR operation ABR2, and the fourth refresh window N3 according to the third ABR operation ABR3 may be different from one another according to temperature of the memory device 100 of FIG. 1. That is, an ABR cycle of self-refresh may be changed.

As described above, the point of time when the third ABR operation of the second self-refresh Self Refresh_2 is to be performed may be determined to be the average of the first-temperature cycle value K1×N1 and the second-temperature cycle value K2×N2, based on the refresh clock signal POSC having the fixed cycle and the maximum count values K1 and K2 which are set according to temperature of the memory device of FIG. 1. Thus, an ABR operation may be prevented from being performed simultaneously with the start of the second self-refresh Self Refresh_2, thereby decreasing refresh current and refresh power consumption.

Figure 6:
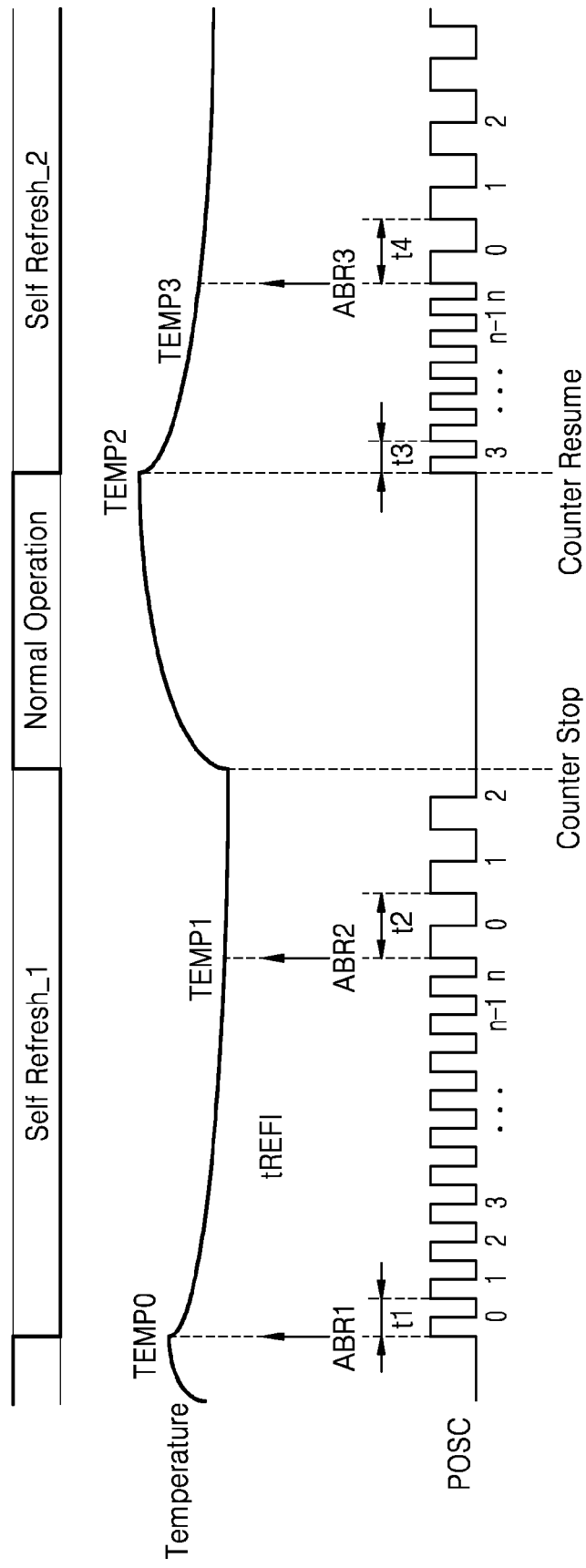
FIG. 6 is a timing diagram of a refresh method of changing an ABR cycle of self-refresh according to an exemplary embodiment.

FIG. 6 is a timing diagram of a refresh method of changing an ABR cycle of self-refresh according to an exemplary embodiment.

Referring to FIG. 6, the normal operation may be performed between first self-refresh Self Refresh_1 and second self-refresh Self Refresh_2. The normal operation may be performed before refresh processing according to a second ABR operation ABR2 of the first self-refresh Self Refresh_1 is ended.

In the present embodiment, in the first and second self-refreshes Self Refresh_1 and Self Refresh_2, the ABR operation may be performed by the counter 153 of FIG. 1 which counts a refresh clock signal POSC from an initial value '0' to a maximum value n so as to perform refresh processing on all the memory cell rows of the whole banks BANK0 to BANK3 of FIG. 1. The maximum count value n may be a fixed value corresponding to the number of all the memory cell rows.

During the first and second self-refreshes Self Refresh_1 and Self Refresh_2, the refresh clock signal POSC may be generated to have a cycle which varies according to temperature and provided by the oscillator 152 of the memory device 100 of FIG. 1. The refresh clock signal POSC may be generated to have a short cycle at high temperature and to have a long cycle at low temperature.

During the first self-refresh Self Refresh_1, when first temperature TEMP0 in a first ABR operation ABR1, second temperature TEMP1 in a second ABR operation ABR2, and third temperature TEMP2 at the start of the second self-refresh Self Refresh_2 after the normal operation is performed are compared with one another, for example, the second temperature TEMP1 may be lower than the first temperature TEMP0 and the third temperature TEMP2 may be higher than the first temperature TEMP0.

According to the first ABR operation ABR1 of the first self-refresh Self Refresh_1, the refresh control circuit 156 of FIG. 1 may generate a refresh clock signal POSC having a first cycle t1 according to the first temperature TEMP0. Refresh processing may be performed on all the memory cell rows of the whole banks BANK0 to BANK3 according to an output count value which is output from the counter 158 when the counter 158 counts the refresh clock signal POSC having the first cycle t1 from '0' to n.

According to the second ABR operation ABR2 of the first self-refresh Self Refresh_1, the refresh control circuit 156 may generate a refresh clock signal POSC having a second cycle t2 based on the second temperature TEMP1. Since the second temperature TEMP1 is lower than the first temperature TEMP0, the second cycle t2 may be set to be longer than the first cycle t1. This means that a refresh cycle may be increased at low temperature. Refresh processing may be performed on corresponding memory cell rows of the banks BANK0 to BANK3 according to an output count value which is output from the counter 158 when the counter 158 counts the refresh clock signal POSC having the second cycle t2 starting from '0'. The counter 158 may stop the counting at the output count value, e.g., '2', due to the normal operation performed before the refresh processing according to the second ABR operation ABR2 is ended.

After the normal operation is performed and the second self-refresh Self Refresh_2 is started, the refresh control circuit 156 may generate a refresh clock signal POSC having a third cycle t3 according to the third temperature TEMP2. Since the third temperature TEMP2 is higher than the first temperature TEMP0, the third cycle t3 may be set to be shorter than the first cycle t1. This means that a refresh cycle may be decreased at high temperature. Refresh processing may be performed according to the second ABR operation ABR2 of the first self-refresh Self Refresh_1 based on an output count value which is output from the counter 158 counts the refresh clock signal POSC having the third cycle t3 starting from '3' after the output count value '2' at which the counting of the refresh clock signal POCS is stopped in the first self-refresh Self Refresh_1.

In some embodiments, a point of time when a third ABR operation ABR3 of the second self-refresh Self Refresh_2 is to be started may be determined to be a point of time after refresh processing is performed on all the memory cell rows of the whole banks BANK0 to BANK3 according to the second ABR operation ABR2 of the first self-refresh Self Refresh_1 while the refresh clock signal POSC having the second cycle t2 and the refresh clock signal POSC having the third cycle t3 are counted from '0' to n. Thus, the third ABR operation ABR3 of the second self-refresh Self Refresh_2 is not performed simultaneously with the start of the second self-refresh Self Refresh_2.

According to the third ABR operation ABR3 of the second self-refresh Self Refresh_2, the refresh control circuit 156 may perform refresh processing on all the memory cell rows of the whole banks BANK0 to BANK3 while counting a refresh clock signal POSC generated to have a fourth cycle t4 based on the fourth temperature TEMP3. Since the fourth temperature TEMP3 is lower than the third temperature TEMP2, the fourth cycle t4 may be set to be longer than the third cycle t3. This means that a refresh cycle may be increased at low temperature.

During the first and second self-refreshes Self Refresh_1 and Self Refresh_2, refresh processing is performed in the first ABR operation ABR1, the second ABR operation ABR2, and the third ABR operation ABR3, based on the refresh clock signals POSC generated to have the different clock cycles t1, t2, t3, and t4 according to temperature of the memory device 100 of FIG. 1. Thus, an ABR cycle of self-refresh may be changed and the ABR operation is prevented from being performed simultaneously with the start of the second self-refresh Self Refresh_2, thereby decreasing refresh current and refresh power consumption.

Figure 7:
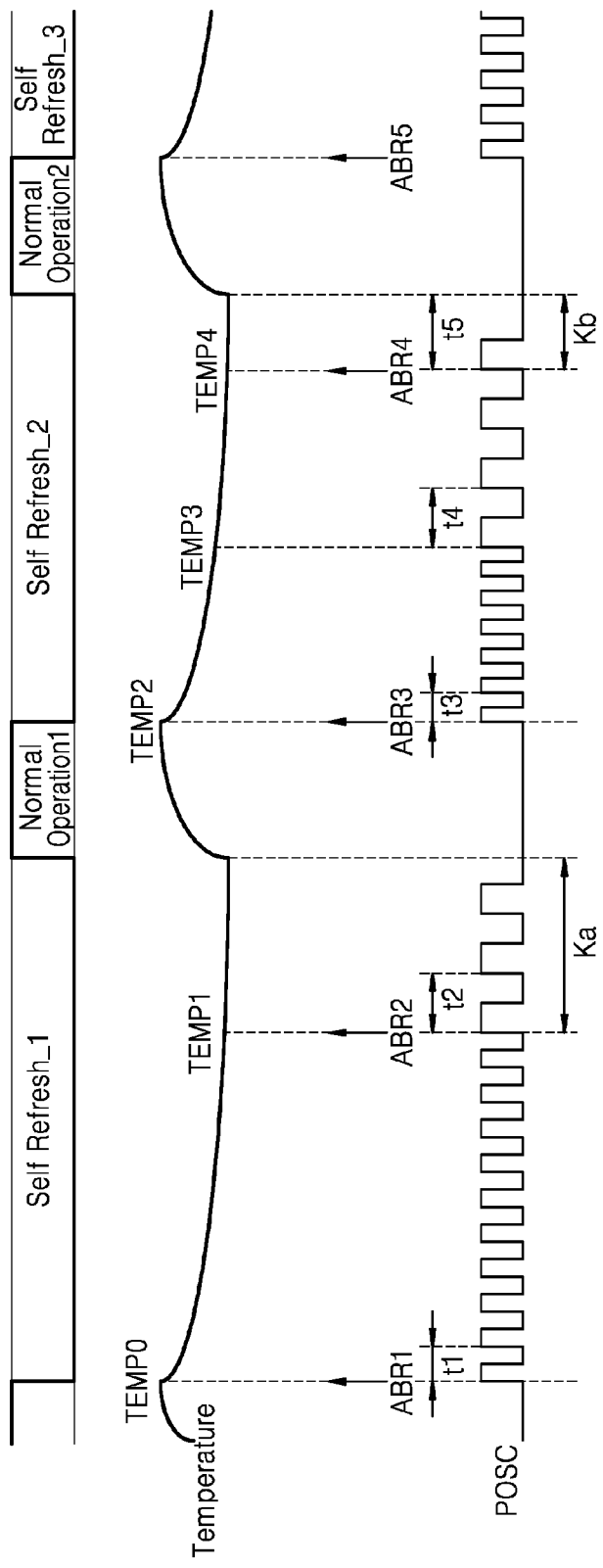
FIGS. 7 and 8 are diagrams illustrating a refresh method of changing an ABR cycle of self-refresh according to an exemplary embodiment.
Figure 8:
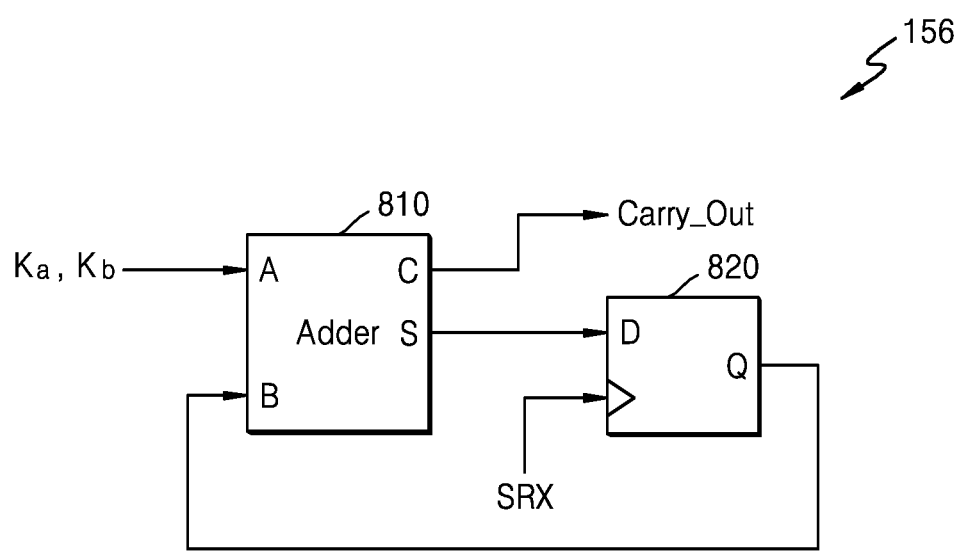

FIGS. 7 and 8 are diagrams illustrating a refresh method of changing an ABR cycle of self-refresh according to an exemplary embodiment. FIG. 7 is a timing diagram illustrating sections in which the ABR operation is stopped due to the normal operation. FIG. 8 illustrates a refresh control circuit.

Referring to FIG. 7, a first ABR operation ABR1 is performed simultaneously with the start of first self-refresh Self Refresh_1, based on a refresh clock signal POSC having a first cycle t1 according to first temperature TEMP0. Thereafter, a second ABR operation ABR2 may be performed based on a refresh clock signal POSC having a second cycle t2 according to second temperature TEMP1. Since the second temperature TEMP1 is lower than the first temperature TEMP0, the second cycle t2 may be set to be longer than the first cycle t1.

In this exemplary embodiment, the second ABR operation ABR2 may be stopped due to a first normal operation Normal Operation1 performed before refresh processing according to the second ABR operation ABR2 of the first self-refresh Self Refresh_1 is completed. In the first self-refresh Self Refresh_1, information regarding a first section Ka in which the second ABR operation ABR2 is performed but interrupted before completion of the first self-refresh Self Refresh_1 due to the start of the first normal operation Normal Operation1 may be provided to the refresh control circuit 156 of FIG. 1.

After the first normal operation Normal Operation1 is performed, a third ABR operation ABR3 may be performed simultaneously with the start of the second self-refresh Self Refresh_2, based on a refresh clock signal POSC having a third cycle t3 according to third temperature TEMP2. Refresh processing may be performed according to the third ABR operation ABR3, based on a refresh clock signal POSC having a fourth cycle t4 according to fourth temperature TEMP3. Since the fourth temperature TEMP3 is lower than the third temperature TEMP2, the fourth cycle t4 may be set to be longer than the third cycle t3.

Thereafter, a fourth ABR operation ABR4 may be performed based on a refresh clock signal POSC having a fifth cycle t5 according to the fifth temperature TEMP4. Since the fifth temperature TEMP4 is lower than the fourth temperature TEMP3, the fifth cycle t5 may be set to be longer than the fourth cycle t4. The fourth ABR operation ABR4 may be stopped due to a second normal operation Normal Operation2 performed before refresh processing according to the fourth ABR operation ABR4 is ended. Information regarding a second section Kb in which the fourth ABR operation ABR4 of the second self-refresh Self Refresh_2 is performed but interrupted before completing the second self-refresh Self Refresh_2 due to the start of the second normal operation Normal Operation2 may be provided to the refresh control circuit 156.

In the exemplary embodiment of FIG. 8, the refresh control circuit 156 may output a carry output signal Carry_Out when a result of adding the first section Ka of the first self-refresh and the second section Kb of the second self-refresh by an adder 810 reaches a self-refresh cycle tSREFI. The carry output signal Carry_Out is a signal instructing to perform the ABR operation simultaneously with the start of subsequent self-refresh. The self-refresh cycle tSREFI may be set to be longer than a refresh cycle tREFI defined in the DRAM standards.

In the refresh control circuit 156, when the result of adding the first and second sections Ka and Kb does not reach the self-refresh cycle tSREFI, an output of the adder 810 may be supplied to a flip-flop 820. The flip-flop 820 may receive the output of the adder 810 according to an exit self-refresh command SRX. The output of the flip-flop 820 may be provided as an input of the adder 810.

The adder 810 may output a carry output signal Carry_Out instructing to perform the ABR operation when the sum of the first and second sections Ka and Kb in which the ABR operations are stopped and the output of the flip-flop 820 reaches the self-refresh cycle tSREFI. In one embodiment, the adder 810 may output the carry output signal Carry_Out instructing to perform the ABR operation when the sum of the first and second sections Ka and Kb and the output of the flip-flop 820 reaches a refresh cycle tREFI which is different from the self-refresh cycle tSREFI.

The refresh control circuit 156 may control a fifth ABR operation ABR5 to be performed simultaneously with the start of third self-refresh Self Refresh_3 according to the carry output signal Carry_Out.

Figure 9A:
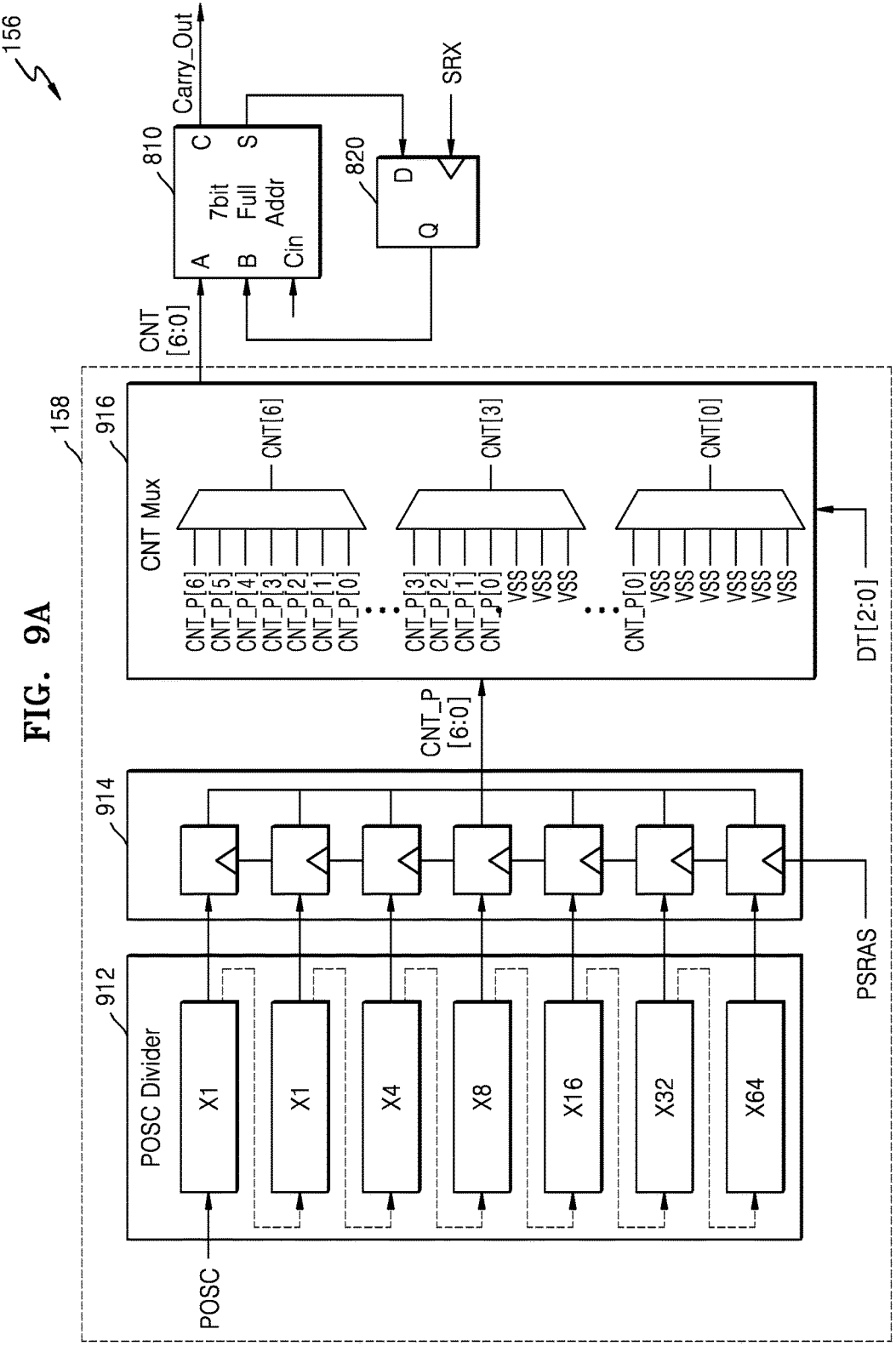
Figure 9B:
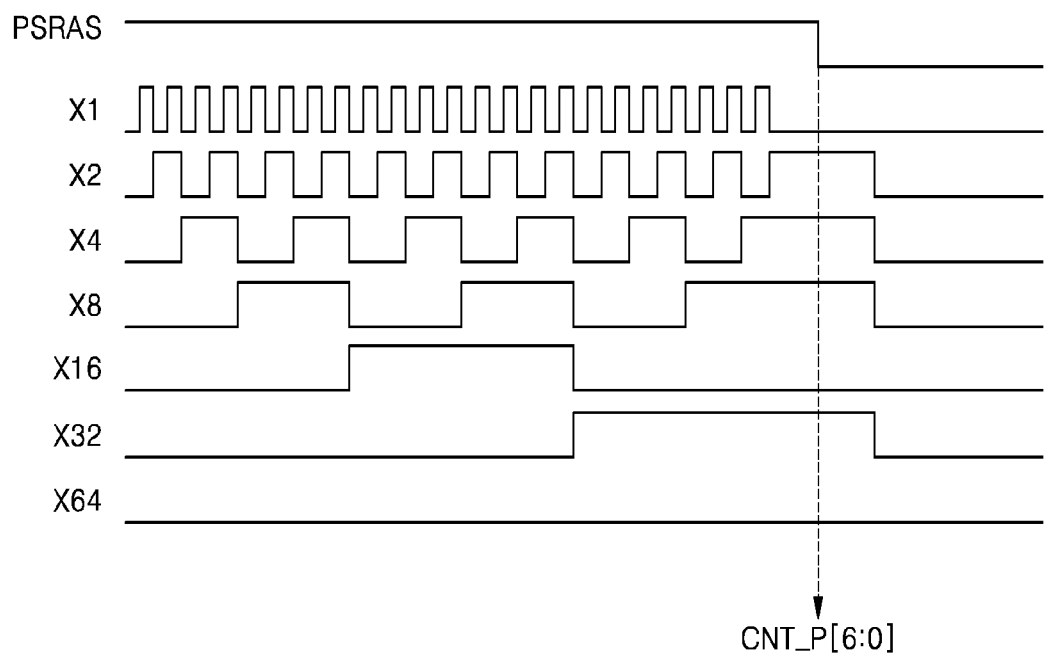
Figure 9C:
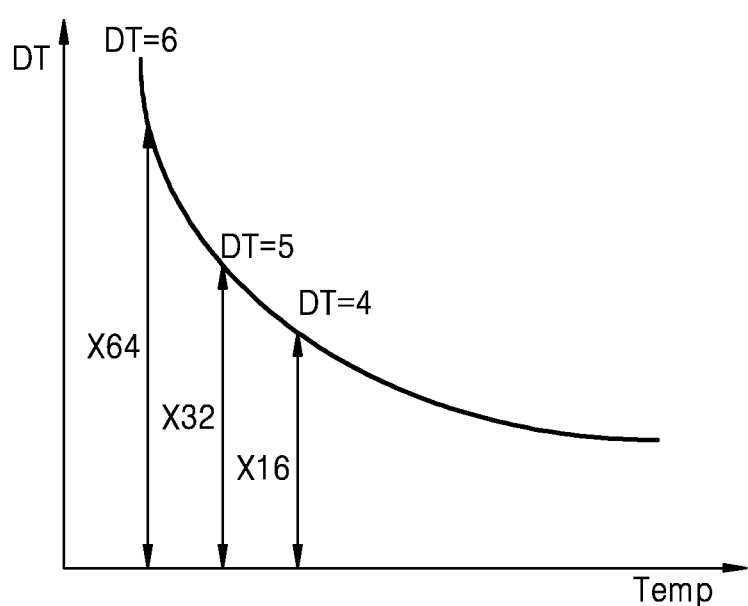

FIGS. 9A to 9E are diagrams illustrating a refresh control circuit according to an exemplary embodiment. FIG. 9A is a circuit diagram of a refresh control circuit 156 such as that shown in FIG. 1. FIG. 9B is a timing diagram illustrating an operation of a counter. FIG. 9C is a diagram illustrating temperature information according to temperature of the memory device of FIG. 1. FIG. 9D is a table illustrating an operation of a count multiplexer. FIG. 9E is a table illustrating an operation of an adder.

Referring to FIG. 9A, the refresh control circuit 156 includes a counter 158 connected to the adder 810 and the flip-flop 820 illustrated in FIG. 8. The counter 158 includes a clock divider 912, a clock latch unit 914, and a count multiplexer 916.

The clock divider 912 may count a refresh clock signal POSC and divide the refresh clock signal POSC by one, two, four, eight, sixteen, thirty-two, and sixty-four to generate clock signals X1, X2, X4, X8, X16, X32, and X64. As illustrated in FIG. 9B, the clock latch unit 914 may latch the clock signals X1, X2, X4, X8, X16, X32, ad X64 output from the clock divider 912 and output them as a first count output CNT_P[6:0] according to a self-refresh control signal PSRAS. The self-refresh control signal PSRAS may be understood as a type of the self-refresh signal PSELF of FIG. 1.

The count multiplexer 916 may output a second count output CNT[6:0] based on temperature information DT[2:0] provided from the temperature sensor 154 of FIG. 1. As illustrated in FIG. 9C, binary information of the relationship between temperature and the temperature information DT[2:0] may be converted into decimal information. As the temperature increases, the temperature information DT may decrease to '6', '5', '4' . . . .

The count multiplexer 916 may output a 7-bit second count output CNT[6:0] based on the clock signals X1 to X64 when the temperature information DT=6, output a 6-bit second count output CNT[5:0] based on the clock signals X1 to X32 when the temperature information DT=5, and output a 5-bit second count output CNT[4:0] based on the clock signals X1 to X16 when the temperature information DT=4. The relationship between the temperature information DT[2:0] and the second count output CNT[6:0] may be represented as illustrated in the table of FIG. 9D by selectively selecting the clock signals X1, X2, X4, X8, X16, X32, and X64 according to the temperature information DT[2:0].

The adder 810 may receive the second count output CNT[6:0] via a first input terminal A and an output of the flip-flop 820 via a second input terminal B, and output a carry output signal Carry_Out according to a truth table of FIG. 9E. As described above with reference to FIG. 8, the adder 810 and the flip-flop 820 may output a carry output signal Carry_Out instructing to perform the ABR operation when the sum of the second count output CNT[6:0] which varies according to the temperature information DT[2:0] and the output of the flip-flop 820 reaches a self-refresh cycle tSREFI. The refresh control circuit 156 may control the ABR operation to be performed simultaneously with the start of subsequent self-refresh according to the carry output signal Carry_Out.

Figure 10:
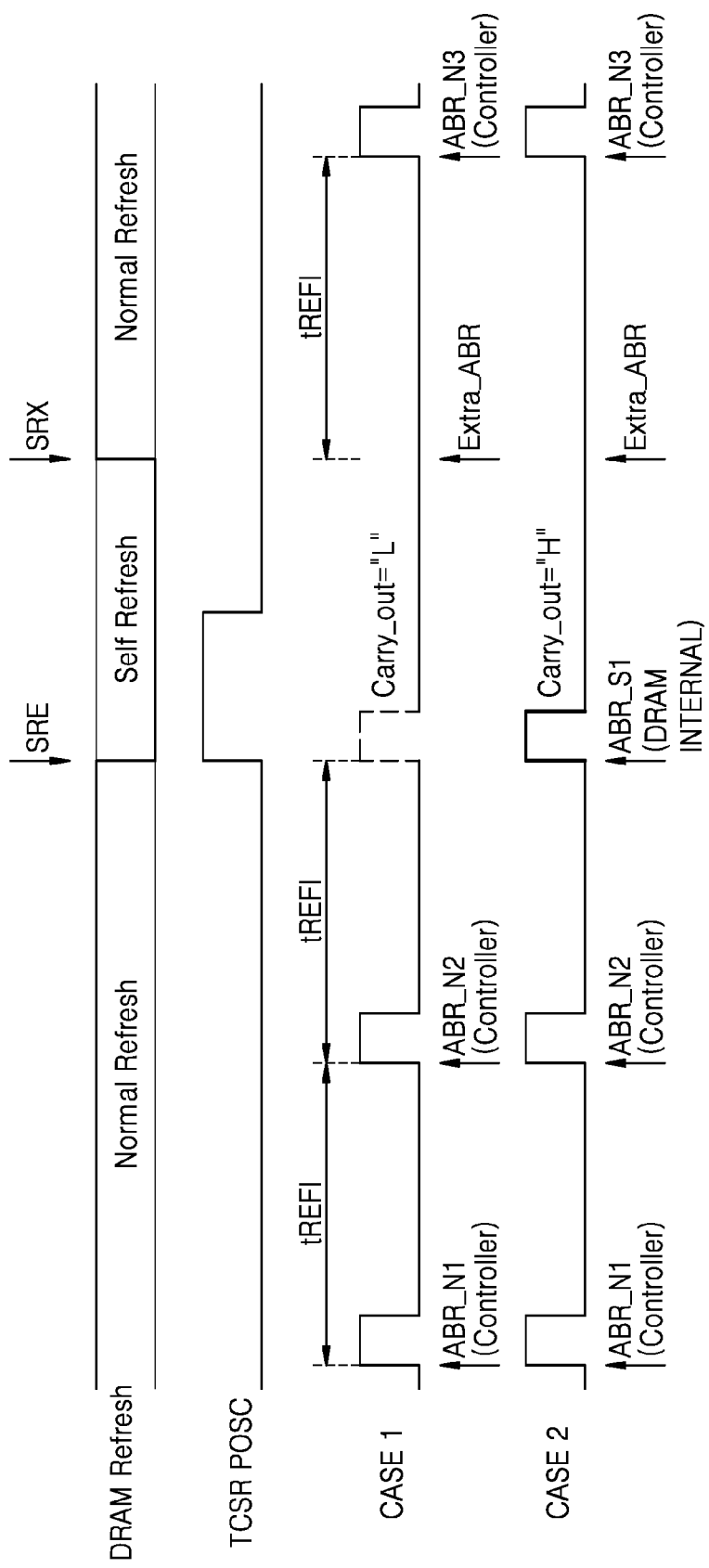
FIG. 10 is a timing diagram of a method of refreshing a memory device according to an exemplary embodiment.

FIG. 10 is a timing diagram of a refresh method according to an exemplary embodiment.

Referring to FIG. 10, in the memory device 100 of FIG. 1, refresh operations may be divided into self-refresh and auto-refresh. The auto refresh may be understood as being included in normal refresh performed according to a refresh command from a memory controller (hereinafter referred to as a 'controller'). In general, in the self-refresh and the normal refresh, the ABR operation may be performed.

During the normal refresh, ABR operations ABR_N1 to ABR_N3 are performed by the controller. During the self-refresh, an ABR operation ABR_S1 may be performed in a DRAM. The memory device 100 may differentiate the ABR operations ABR_N1 to ABR_N3 performed by the controller and the ABR operation ABR_S1 performed in the DRAM from one another, based on a refresh clock signal POSC having a cycle varying according to temperature. That is, the refresh clock signal POSC may be generated only during the ABR operation ABR_S1 performed in the DRAM.

The ABR operations ABR_N1 to ABR_N3 may be performed by the controller in a refresh cycle tREFI. According to the DRAM standards, at least one extra refresh command may be required between an 'exit self-refresh' command SRX and an 'enter self-refresh' command SRE. After the 'exit self-refresh' command SRX of the DRAM, in the refresh cycle tREFI, at least one extra refresh command is required for the DRAM in addition to a normal refresh command. Thus, the DRAM may control the controller to perform an extra ABR operation Extra_ABR and an ABR operation ABR_N3.

The refresh control circuit 156 of FIG. 9A may output a carry output signal Carry_Out representing whether the sum of sections in which performing of ABR operations in the DRAM are stopped during self-refresh corresponds to a self-refresh cycle tSREF. When the carry output signal Carry_Out is logic low ('L') (Case 1), the ABR operation may be controlled to be not performed simultaneously with the start of self-refresh. When the carry output signal Carry_Out is logic high ('H') (Case 2), the ABR operation ABR_S1 may be performed in the DRAM simultaneously with the start of the self-refresh operation.

Figure 11:
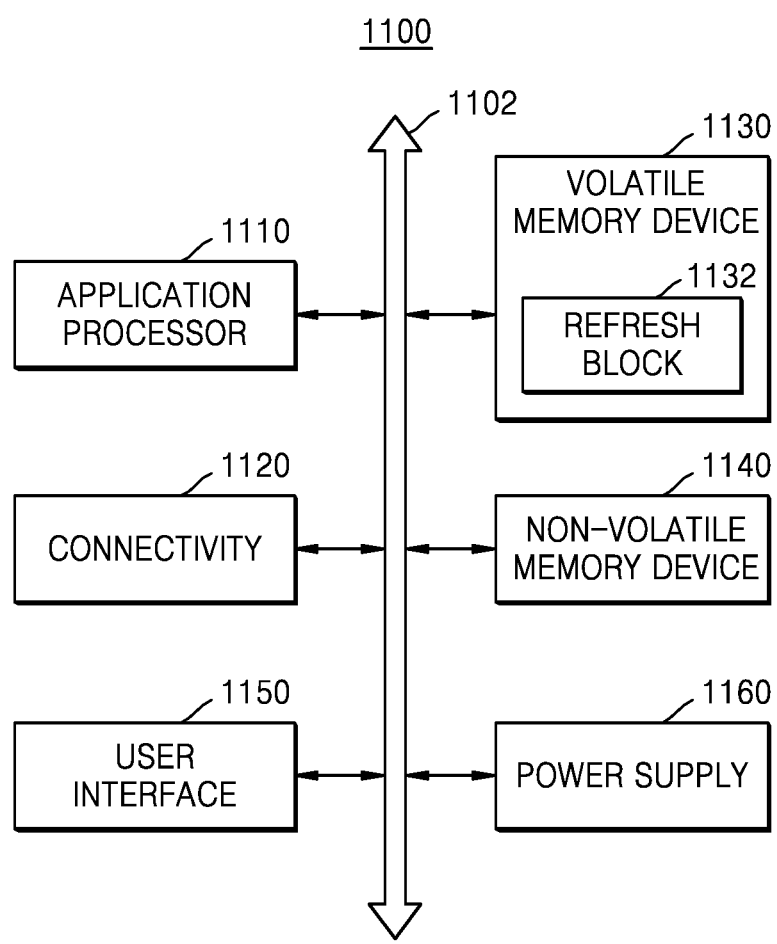
FIG. 11 is a block diagram of a mobile system to which a memory device including a refresh block is applied according to an exemplary embodiment.

FIG. 11 is a block diagram of a mobile system 1100 to which a memory device including a refresh block is applied according to an exemplary embodiment.

Referring to FIG. 11, the mobile system 1100 may include an application processor 1110, a connectivity unit 1120, a first memory device 1130, a second memory device 1140, a user interface 1150, and a power supply 1160 which are connected to one another via a bus 1102. The first memory device 1130 may be set to be a volatile memory device and the second memory device 1140 may be set to be a nonvolatile memory device.

In one embodiment, the mobile system 1100 may be an arbitrary mobile system such as a mobile phone, a smart phone, a personal digital assistant (PDA), a portable multimedia player (PMP), a digital camera, a music player, a portable game console, a navigation system, etc.

The application processor 1110 may execute applications providing an Internet browser, a game, video, etc. In one embodiment, the application processor 1110 may include a single core or multi-cores. For example, the application processor 1110 may include dual-cores, quad-cores, hexa-cores, etc. In one embodiment, the application processor 1110 may further include a cache memory inside or outside the application processor 1110.

The connectivity unit 1120 may establish wireless communication or wire communication with an external device. For example, the connectivity unit 1120 may establish Ethernet communication, near-field communication (NFC), radio-frequency identification (RFID) communication, mobile telecommunication, memory card communication, universal serial bus (USB) communication, etc. For example, the connectivity unit 1120 may include a baseband chipset and support communication such as GSM, GRPS, WCDMA, HSxPA, etc.

The first memory device 1130 which is a volatile memory device may store, as write data, data processed by the application processor 1110 or function as a working memory. The first memory device 1130 includes a refresh block 1132 configured to generate a refresh clock signal according to a self-refresh command and to control an ABS cycle of self-refresh based on the refresh clock signal. The memory device 1130 may control the ABR operation to be not performed simultaneously with the start of self-refresh, based on a refresh clock signal having a fixed cycle and a maximum count value which is set according to temperature. The memory device 1130 may control the ABR operation to be not performed simultaneously with the start of the self-refresh, based on a refresh clock signal having a cycle varying according to temperature and a fixed maximum count value. The memory device 1130 may perform first self-refresh and second self-refresh according to temperature, and control the ABR operation to be performed at the start of third self-refresh when the sum of a section of the first self-refresh in which the ABR operation is not performed and a section of the second self-refresh in which the ABR operation is not performed corresponds to a self-refresh cycle.

In some embodiments, the second memory device 1140 which is a nonvolatile memory device may store a boot image for booting the mobile system 1100. For example, the second memory device 1140 may be an electrically erasable programmable read-only memory (EEPROM), a flash memory, a phase-change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The user interface 1150 may include at least one input device, such as a keypad or a touch screen, and/or at least one output device such as a speaker or a display device. The power supply 1160 may supply operating voltages. In one embodiment, the mobile system 1100 may further include a camera image processor (CIP), and a storage device such as a memory card, a solid-state drive (SSD), a hard disk drive (HDD), a CD-ROM, etc.

Figure 12:
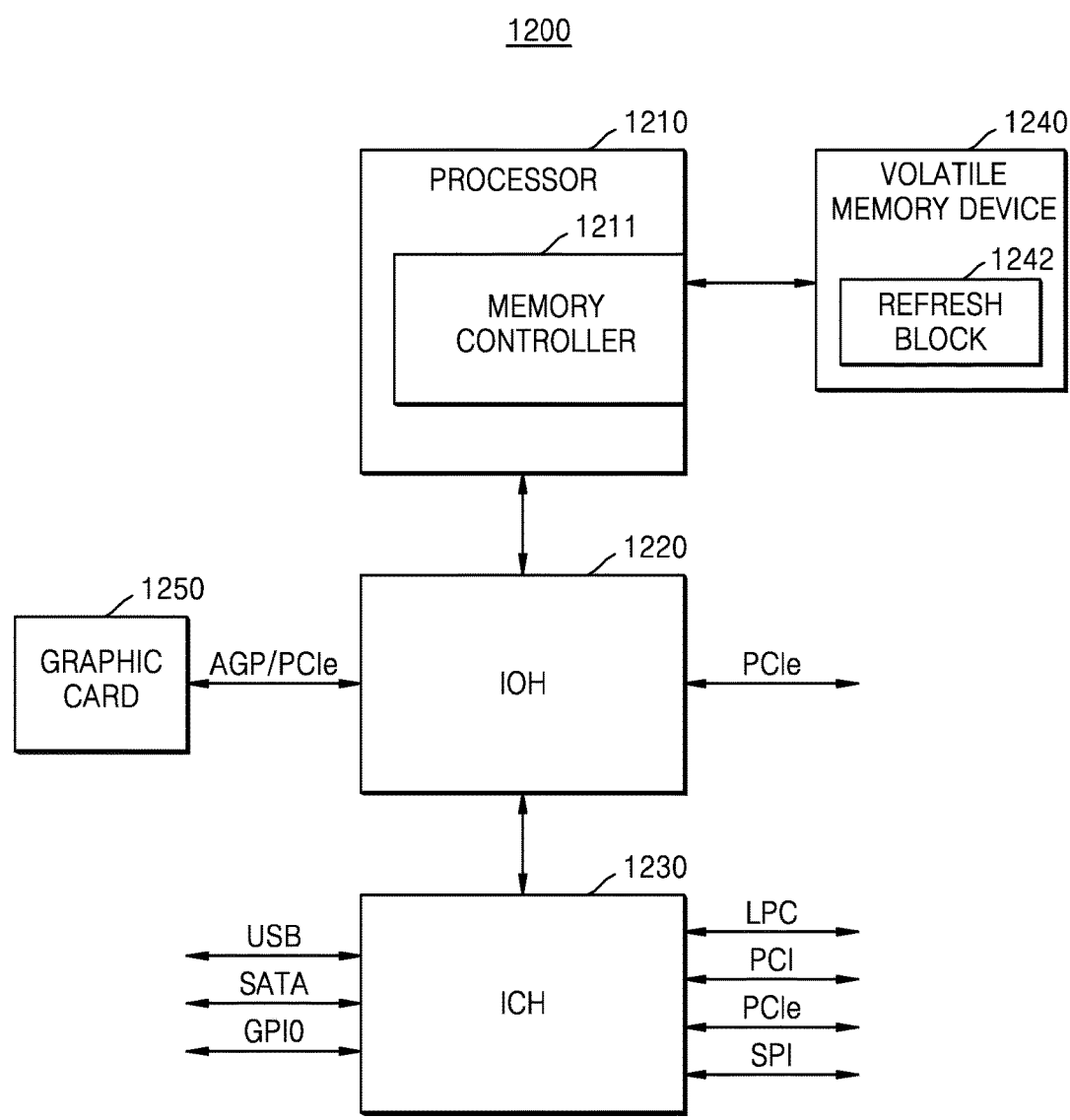
FIG. 12 is a block diagram of a computer system to which a memory device including a refresh block is applied according to an exemplary embodiment.

FIG. 12 is a block diagram of a computer system 1200 to which a memory device including a refresh block is applied according to an exemplary embodiment.

Referring to FIG. 12, the computer system 1200 includes a processor 1210, an input/output hub (IOH) 1220, an input/output controller hub (ICH) 1230, a memory device 1240, and a graphic card 1250. In one embodiment, the computer system 1200 may be an arbitrary computer system such as a personal computer (PC), a server computer, a workstation, a laptop computer, a mobile phone, a smart phone, a personal digital assistant: (PDA), a portable multimedia player (PMP), a digital camera, a digital television (DTV), a set-top box, a music player, a portable game console, a navigation system, etc.

The processor 1210 may perform various computing functions such as specific calculation or tasks. For example, the processor 1210 may be a microprocessor or a central processing unit (CPU). In one embodiment, the processor 1210 may include dual-cores or multi-cores. For example, the processor 1210 may include dual-cores, quad-cores, hexa-cores, etc. Although FIG. 12 illustrates the computing system 1200 as including one processor 1210, the computing system 1200 may include a plurality of processors according to an embodiment. In one embodiment, the processor 1210 may further include a cache memory inside or outside the processor 1210.

The processor 1210 may include a memory controller 1211 for controlling an operation of the memory device 1240. The memory controller 1211 included in the processor 1210 may be referred to as an integrated memory controller (IMC). In one embodiment, the memory controller 1211 may be located inside the IOH 1220. The IOH 1220 including the memory controller 1211 may be referred to as a memory controller hub (MCH).

The memory device 1240 may include a refresh block 1132 configured to generate a refresh clock signal according to a self-refresh command and to control an ABR cycle of self-refresh based on the refresh clock signal. The memory device 1240 may control the ABR operation to be not performed simultaneously with the start of self-refresh, based on a refresh clock signal having a fixed cycle and a maximum count value which is set according to temperature. The memory device 1240 may control the ABR operation to be not performed simultaneously with the start of the self-refresh, based on a refresh clock signal having a cycle varying according to temperature and a fixed maximum count value. The memory device 1240 may perform first self-refresh and second self-refresh according to temperature, and control the ABR operation to be performed at the start of third self-refresh when the sum of a section of the first self-refresh in which the ABR operation is not performed and a section of the second self-refresh in which the ABR operation is not performed corresponds to a self-refresh cycle.

The IOH 1220 may manage exchange of data between devices such as the graphic card 1250 and the processor 1210. The IOH 1220 may be connected to the processor 1210 via various interfaces. For example, the IOH 1220 and the processor 1210 may be connected via interfaces according to various standards, e.g., a front side bus (FSB), a system bus, a HyperTransport, a lighting data transport (LDT), a QuickPath Interconnect (QPI), a common system interface, a peripheral component interface-express (CSI), etc. Although FIG. 12 illustrates the computing system 1200 as including one IOH 1220, the computing system 100 may include a plurality of IOHs according to another embodiment.

The IOH 1220 may provide various interfaces with devices. For example, the IOH 1220 may provide an accelerated graphics port (AGP) interface, a peripheral component interface-express (PCIe), a communications streaming architecture (CSA) interface, etc.

The graphic card 1250 may be connected to the IOH 1229 via the AGP interface or the PCIe. The graphic card 1250 may drive a display device (not shown) for displaying an image. The graphic card 1250 may include an inner processor configured to process image data, and an inner semiconductor memory device. In one embodiment, the IOH 1220 may include a graphic device therein, together with or instead of the graphic card 1250 outside the IOH 1220. The graphic device included in the IOH 1220 may be referred to as an integrated graphic device. Also, the IOH 1220 including a memory controller and the graphic device may be referred to as a graphics and memory controller hub (GMCH).

The ICH 1230 may perform data buffering and interface mediation so that various system interfaces may be efficiently operated. The ICH 1230 may be connected to the IOH 1220 via an inner bus. For example, the IOH 1220 and the ICH 1230 may be connected to each other via a direct media interface (DMI), a hub interface, an enterprise southbridge interface (ESI), a PCIe, etc.

The ICH 1230 may provide various interfaces with peripheral devices. For example, the ICH 1230 may provide a USB port, a serial advanced technology attachment (SATA) port, a general-purpose input/output (GPIO), a low pin count (LPC) bus, a serial peripheral interface (SPI), a PCI, a PCIe, etc.

In one embodiment, at least two elements among the processor 1210, the IOH 1220, and the ICH 1230 may be embodied as one chip set together.

While the inventive concept has been particularly shown and described with reference to exemplary embodiments thereof, it will be understood that various changes in form and details may be made therein without departing from the spirit and scope of the following claims.

What is claimed is:

1. A method of refreshing a memory device, the method comprising:
   generating a refresh clock signal according to an enter self-refresh command and an exit self-refresh command; and
   performing self-refresh to refresh memory cell rows according to the refresh clock signal,
   wherein, the step of performing self-refresh comprises:
   performing a first self-refresh according to a first inner temperature of the memory device; and
   performing a second self-refresh according to a second inner temperature of the memory device, and
   wherein, when the second inner temperature is different than the first inner temperature, controlling a self-refresh cycle in a manner such that an all-bank-refresh (ABR) operation of the second self-refresh is not performed simultaneously with start of the second self-refresh.

2. The method of claim 1, wherein the performing of the self-refresh comprises:
   generating the refresh clock signal having a fixed cycle during the first self-refresh and the second self-refresh;
   setting a first maximum count value according to the first inner temperature during the first self-refresh;
   setting a second maximum count value according to the second inner temperature during the second self-refresh; and
   performing an ABR operation of the second self-refresh, based on the refresh clock signal and the first and second maximum count values.

3. The method of claim 2, wherein, when the second inner temperature is higher than the first inner temperature, the second maximum count value is set to be greater than the first maximum count value.

4. The method of claim 2, wherein the performing of the ABR operation of the second self-refresh comprises:

calculating a first-temperature cycle value by multiplying a number of first clock cycles of the refresh clock signal during the first self-refresh by the first maximum count value;

calculating a second-temperature cycle value by multiplying a number of second clock cycles of the refresh clock signal during the second self-refresh by the second maximum count value; and starting the ABR operation of the second self-refresh at a point of time corresponding to an average of the first-temperature cycle value and the second-temperature cycle value.

5. The method of claim 1, wherein the performing of the self-refresh comprises:

generating a first refresh clock signal having a first cycle according to the first inner temperature during the first self-refresh;

generating a second refresh clock signal having a second cycle according to the second inner temperature during the second self-refresh;

setting a maximum count value during the first self-refresh and the second self-refresh; and performing an ABR operation of the second self-refresh, based on the first and second refresh clock signals having the first and second cycles and the maximum count value.

6. The method of claim 5, wherein, when the second temperature is higher than the first temperature, the second cycle is set to be shorter than the first cycle.

7. The method of claim 5, wherein the performing of the ABR operation of the second self-refresh comprises:

counting a number of first clock cycles of the first refresh clock signal during the first self-refresh;

counting a number of second clock cycles of the second refresh clock signal during the second self-refresh right after counting the number of the first clock cycles; and starting the ABR operation of the second self-refresh when the number of the second clock cycles reaches the maximum count value.

8. A method of refreshing a memory device, the method comprising:

performing a first self-refresh according to a first inner temperature of the memory device, wherein the first self-refresh includes a first section where an all-bank-refresh (ABR) operation of the first self-refresh is performed but interrupted before completing the first self-refresh due to start of a first normal operation;

performing a second self-refresh according to a second inner temperature of the memory device, wherein the second self-refresh includes a second section where an all-bank-refresh (ABR) operation of the second self-refresh is performed but interrupted before completing the second self-refresh due to start of a second normal operation; and performing an all-bank-refresh (ABR) operation at start of a third self-refresh when a sum of the first section of the first self-refresh and the second section of the second self-refresh corresponds to a self-refresh cycle.

9. The method of claim 8, wherein the performing of the ABR operation at the start of the third self-refresh comprises:

counting a number of first clock cycles of a refresh clock signal having a first cycle in the first section;

counting a number of second clock cycles of the refresh clock signal having a second cycle in the second section; and performing the ABR operation at the start of the third self-refresh when a sum of a first time which is a product of the first cycle and the number of the first clock cycles and a second time which is a product of the second cycle and the number of the second clock cycles corresponds to the self-refresh cycle.

10. The method of claim 9, wherein the ABR operation of the third self-refresh is performed according to an enter self-refresh command.

11. The method of claim 9, wherein, when a sum of the first time and the second time does not correspond to the self-refresh cycle, the performing of the ABR operation of the third self-refresh comprises inputting the sum of the first time and the second time to a flip-flop according to an exit self-refresh command.

12. The method of claim 11, wherein the ABR operation of the self-refresh is started at a point of time when the sum of the first time and the second time and an output of the flip-flop corresponds to the self-refresh cycle.

13. The method of claim 9, wherein each of the counting of the first clock cycles and the counting of the second clock cycles comprises:

counting the refresh clock signal, dividing the refresh clock signal and generating divided clock signals;

providing the number of the first clock cycles by selectively latching the divided clock signals based on information regarding the first inner temperature of the memory device; and providing the number of the second clock cycles by selectively latching the divided clock signals based on information regarding the second inner temperature of the memory device.

14. The method of claim 8, further comprising:

generating a first refresh clock signal having a first cycle according to the first inner temperature of the memory device during the first self-refresh; and generating a second refresh clock signal having a second cycle according to the second inner temperature of the memory device during the second self-refresh.

15. The method of claim 14, wherein, when the second inner temperature is higher than the first inner temperature, the second cycle is set to be shorter than the first cycle.

16. A method of refreshing a memory device, the method comprising:

generating a refresh clock signal according to an enter self-refresh command and an exit self-refresh command; and performing self-refresh to refresh memory cell rows according to the refresh clock signal, wherein, the step of performing self-refresh comprises:

performing a first self-refresh according to a first inner temperature of the memory device; and performing a second self-refresh according to a second inner temperature of the memory device, and wherein, when the second inner temperature is higher than the first inner temperature, controlling a self-refresh cycle in a manner such that an all-bank-refresh (ABR) operation of the second self-refresh is performed at a later point of time after the start of the second self-refresh.

17. The method of claim 16, wherein the ABR operation of the second self-refresh is performed according to a third inner temperature of the memory device which is lower than the second inner temperature of the memory device.

18. The method of claim 16, wherein the step of performing self-refresh comprises:

generating the refresh clock signal having a fixed cycle during the first self-refresh and the second self-refresh;

setting a first maximum count value according to the first inner temperature during the first self-refresh;

setting a second maximum count value according to the second inner temperature during the second self-refresh; and performing an ABR operation of the second self-refresh, based on the refresh clock signal and the first and second maximum count values.

19. The method of claim 18, wherein the performing of the ABR operation of the second self-refresh comprises:

calculating a first-temperature cycle value by multiplying a number of first clock cycles of the refresh clock signal during the first self-refresh by the first maximum count value;

calculating a second-temperature cycle value by multiplying a number of second clock cycles of the refresh clock signal during the second self-refresh by the second maximum count value; and starting the ABR operation of the second self-refresh at a point of time corresponding to an average of the first-temperature cycle value and the second-temperature cycle value.

20. The method of claim 16, the step of performing self-refresh comprises:

generating a first refresh clock signal having a first cycle according to the first inner temperature during the first self-refresh;

generating a second refresh clock signal having a second cycle according to the second inner temperature during the second self-refresh;

setting a maximum count value during the first self-refresh and the second self-refresh; and performing an ABR operation of the second self-refresh, based on the first and second refresh clock signals having the first and second cycles and the maximum count value.

* * * * *